US006486749B1

(12) United States Patent
Tichauer et al.

(10) Patent No.: US 6,486,749 B1
(45) Date of Patent: Nov. 26, 2002

(54) FOUR-WAY POWER COMBINER/SPLITTER

(75) Inventors: Larry M. Tichauer, La Palma, CA (US); Louis D. Pines, Redondo Beach, CA (US)

(73) Assignee: Ophir RF, Inc., Los Angeles, CA (US)

( * ) Notice: Subject to any disclaimer, the term of this patent is extended or adjusted under 35 U.S.C. 154(b) by 0 days.

(21) Appl. No.: 09/566,195

(22) Filed: May 5, 2000

(51) Int. Cl.[7] .............................. H01P 5/12; H01P 3/08; H03H 5/00

(52) U.S. Cl. .......................... 333/125; 333/26; 333/127

(58) Field of Search ................................ 333/125, 127, 333/26, 4, 123, 136

(56) References Cited

U.S. PATENT DOCUMENTS

| | | | | |
|---|---|---|---|---|
| 3,904,990 A | | 9/1975 | La Rosa | 333/128 |
| 4,119,914 A | * | 10/1978 | Duncan | 325/446 |
| 4,182,996 A | * | 1/1980 | Spence | 333/100 |
| 4,371,845 A | | 2/1983 | Pitzalis, Jr. | 330/277 |
| 4,463,326 A | | 7/1984 | Hom | 333/128 |
| 4,556,856 A | | 12/1985 | Presser | 333/124 |
| 4,647,868 A | | 3/1987 | Mueller | 330/286 |
| 4,721,929 A | | 1/1988 | Schnetzer | 333/127 |
| 4,774,481 A | | 9/1988 | Edwards et al. | 333/127 |
| 4,803,443 A | | 2/1989 | Takagi et al. | 330/277 |
| 4,835,496 A | | 5/1989 | Schellenberg et al. | 333/128 |
| 4,916,410 A | | 4/1990 | Littlefield | 330/295 |
| 5,006,822 A | | 4/1991 | Reddy | 333/112 |
| 5,021,755 A | | 6/1991 | Gustafson | 333/128 |
| 5,111,166 A | * | 5/1992 | Plonka et al. | 333/128 |
| 5,237,295 A | | 8/1993 | Reddick et al. | 333/131 |
| 5,410,281 A | | 4/1995 | Blum | 333/127 |
| 5,668,510 A | | 9/1997 | Humpherys | 333/127 |
| 6,300,848 B1 | * | 10/2001 | Miyaji et al. | 333/109 |

* cited by examiner

*Primary Examiner*—Robert Pascal
*Assistant Examiner*—Kimberly E Glenn
(74) *Attorney, Agent, or Firm*—Blakely, Sokoloff, Taylor & Zafman LLP

(57) ABSTRACT

A four-way power combiner/splitter is disclosed that includes a first transmission line having a first non-grounding conductor and a first grounding conductor, wherein the first grounding conductor is grounded at a first end of the first transmission line. The combiner/splitter also has a second transmission line having a second non-grounding conductor and a second grounding conductor, wherein the second grounding conductor is grounded at a first end of the second transmission line. The non-grounding conductors of the first and second transmission lines are electrically coupled together at the respective first ends of the first and second transmission lines. An output/input port is provided that is electrically coupled to the first and second non-grounding conductors at the respective first ends of the first and second transmission lines. Additionally provided are a first input/output port electrically coupled to the first non-grounding conductor at a second end of the first transmission line, a second input/output port electrically coupled to the first grounding conductor at the second end of the first transmission line, a third input/output port electrically coupled to the second non-grounding conductor at a second end of the second transmission line, and a fourth input/output port electrically coupled to the second grounding conductor at a second end of the second transmission line.

6 Claims, 3 Drawing Sheets

FOUR-WAY POWER COMBINER/SPLITTER

FIELD OF THE INVENTION

This invention relates generally to radio frequency (RF)/microwave circuits, and in particular, to a unique four-way power combiner/splitter.

BACKGROUND OF THE INVENTION

Power combiners and splitters have many applications in the RF/microwave field. They are particularly useful in power amplification applications. For example, often an input signal to be amplified is split using a power splitter into several components and applied separately to a plurality of amplification stages. Each of the amplification stages amplifies each of the components of the input signal. Then, the amplified components of the input signals are applied to a power combiner to recombine the amplified components into a relatively higher power and gain output signals.

Prior art power combiners and splitters typically operate over a relatively narrow bandwidth. This is because many prior art power combiners and splitter use transmission lines of particular electrical lengths to adjust the phases of the signals so that the signals are properly combined or split. Since the electrical length of a transmission line is dependent on the frequency of the signal, these prior art combiners and splitters do not work well with frequencies outside the intended operating frequency. As a result, most prior art power combiners and splitters have relatively narrow bandwidth.

Thus, there is a need for a power combiner and splitter that does not depend on a transmission line or lines being a particular electrical length in order to provide much greater operating bandwidths. Such a need is met by the invention described herein.

SUMMARY OF THE INVENTION

An aspect of the invention includes a four-way power combiner/splitter that includes a first transmission line having a first non-grounding conductor and a first grounding conductor, wherein the first grounding conductor is grounded at a first end of the first transmission line. The combiner/splitter also has a second transmission line having a second non-grounding conductor and a second grounding conductor, wherein the second grounding conductor is grounded at a first end of the second transmission line. The non-grounding conductors of the first and second transmission lines are electrically coupled together at the respective first ends of the first and second transmission lines. An output/input port is provided that is electrically coupled to the first and second non-grounding conductors at the respective first ends of the first and second transmission lines. Additionally provided are a first input/output port electrically coupled to the first non-grounding conductor at a second end of the first transmission line, a second input/output port electrically coupled to the first grounding conductor at the second end of the first transmission line, a third input/output port electrically coupled to the second non-grounding conductor at a second end of the second transmission line, and a fourth input/output port electrically coupled to the second grounding conductor at a second end of the second transmission line.

The four-way power combiner/splitter may include a first impedance element electrically connecting the first and second non-grounding conductors at the respective second ends of the transmission lines, and a second impedance element electrically connecting the second and fourth grounding conductors at the respective second ends of the transmission lines. The first and second impedance elements are selected to improve the balance of currents flowing through the first and second transmission lines. In addition, the four-way power combiner/splitter may include first and second ferrites coupled respectively to the first and second transmission lines to increase the effective electrical lengths of the lines. The transmission lines each may be configured into a twisted pair of wires, a coaxial transmission line, a microstrip, a striplines, or other forms of transmission line mediums.

DETAILED DESCRIPTION OF THE INVENTION

Figure 1:
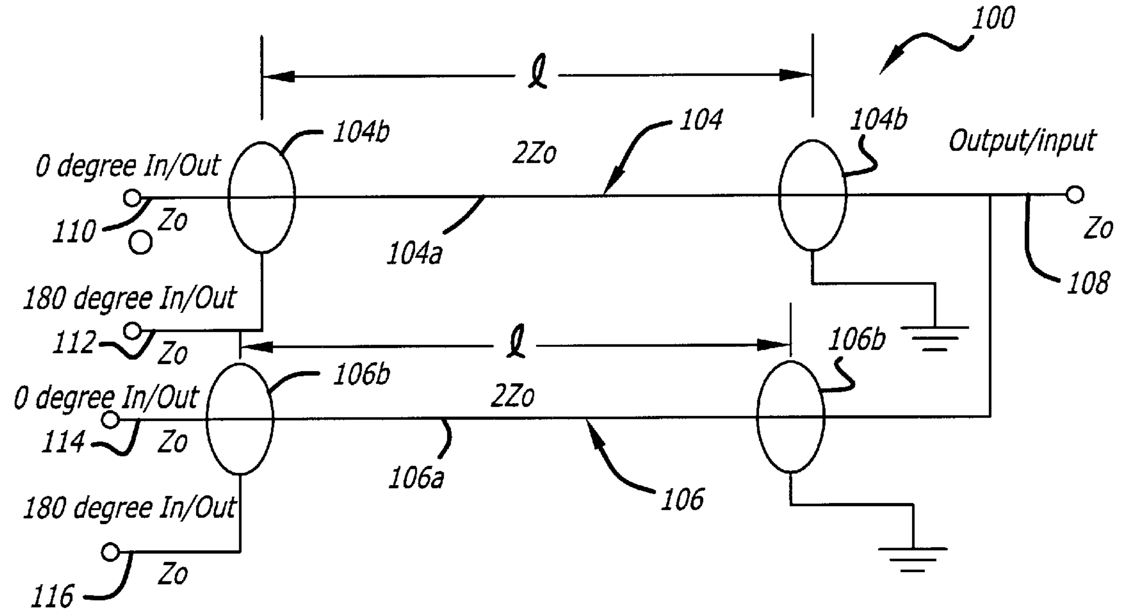
FIG. 1 illustrates a schematic diagram of an exemplary four-way power combiner/splitter in accordance with the invention.

FIG. 1 illustrates a schematic diagram of an exemplary four-way power combiner/splitter 100 in accordance with the invention. The four-way combiner/splitter 100 comprises a pair of transmission lines 104 and 106. As typical of many transmission lines, transmission line 104 comprises a non-grounding conductor 104*a* and a grounding conductor 104*b*. Likewise, transmission line 106 comprises a non-grounding conductor 106*a* and a grounding conductor 106*b*. At or near a first end, the non-grounding conductors 104 and 106*a* of transmission lines 104 and 106 are electrically coupled together to form an output/input port 108. Also at or near the first end, the grounding conductors 104*b* and 106*b* of the transmission lines 104 and 106 are electrically connected to ground.

At a second end opposite the first end, the non-grounding and grounding conductors 104*a-b* of the transmission line 104 form first and second input/output ports 110 and 112 of the four-way power combiner/splitter 100. Also, at the second end, the non-grounding and grounding conductors 106*a-b* of the transmission line 106 form third and fourth input/output ports 114 and 116 of the four-way combiner/splitter 100. In order for the four-way power combiner/ splitter 100 to operate in a balanced condition, the signals at the first and third input/output ports 110 and 114 are substantially in-phase with the signal at the output/input port 108, and the signals at the second and fourth input/output ports 112 and 116 are approximately 180 degrees out-of-phase with the signal at the output/input port 108.

Each of the ports 108, 110, 112, 114 and 116 of the four-way power combiner/splitter 100 has a characteristic impedance defined as Zo. The characteristic impedance of the transmission lines 104 and 106, however, is approximately 2 Zo (i.e. approximately twice the characteristic impedance of the ports 108, 110, 112, 114 and 116). The electrical lengths of the transmission lines 104 and 106 are substantially equal to each other. In addition, the electrical lengths of the transmission lines 104 and 106 are below a quarter wavelength at the lowest operating frequency of the four-way power combiner/splitter 100. The transmission lines 104 and 106 can be a twisted pair of wires, a coaxial transmission line, microstrip, stripline, and other forms of transmission lines.

Figure 2:
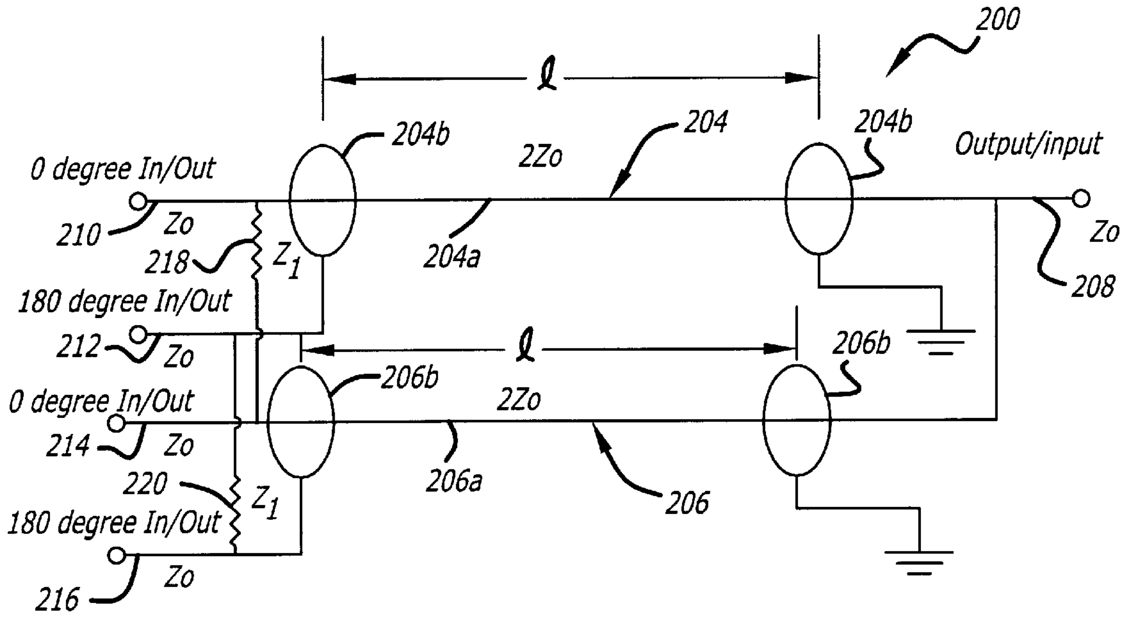
FIG. 2 illustrates a schematic diagram of another exemplary four-way power combiner/splitter in accordance with the invention.

FIG. 2 illustrates a schematic diagram of another exemplary four-way power combiner/splitter 200 in accordance with the invention. The four-way power combiner/splitter 200 has many of the same elements as four-way power combiner/splitter 100, which are designated with the same reference numbers but with the most significant digit being a "2" instead of a "1". The four-way power combiner/splitter 200 further includes an impedance element 218 (Z1) electrically connecting input/output port 210 with input/output port 214. Likewise, the four-way power combiner/splitter 200 also includes another impedance element 220 (Z1) electrically connecting input/output port 212 with input/output port 216. The impedance elements, preferably being substantially resistive, 218 and 220 improve the balance of the currents through the transmission lines 104 and 106 to account for imperfections in the four-way power combiner/splitter 200.

Figure 3:
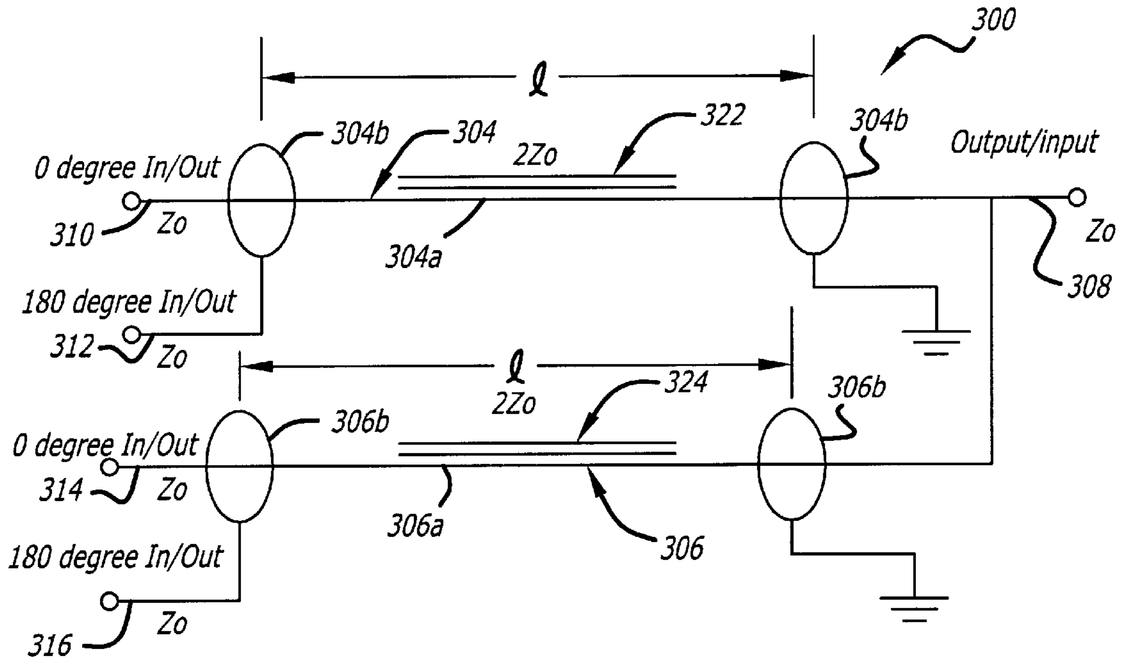
FIG. 3 illustrates a schematic diagram of yet another exemplary four-way power combiner/splitter in accordance with the invention.

FIG. 3 illustrates a schematic diagram of yet another exemplary four-way power combiner/splitter 300 in accordance with the invention. The four-way power combiner/splitter 300 also has many of the same elements as four-way power combiner/splitter 100, which are designated with the same reference numbers but with the most significant digit being a "3" instead of a "1". The four-way power combiner/splitter 300 further includes a ferrite 322 magnetically coupled to the transmission line 304 and a ferrite 324 magnetically coupled to transmission line 306. The ferrites 322 and 324 increase the effective electrical lengths of the transmission lines 304 and 306, respectively. This is particularly useful for relatively low frequency applications where the wavelengths of the operating signals are relatively long.

Figure 4:
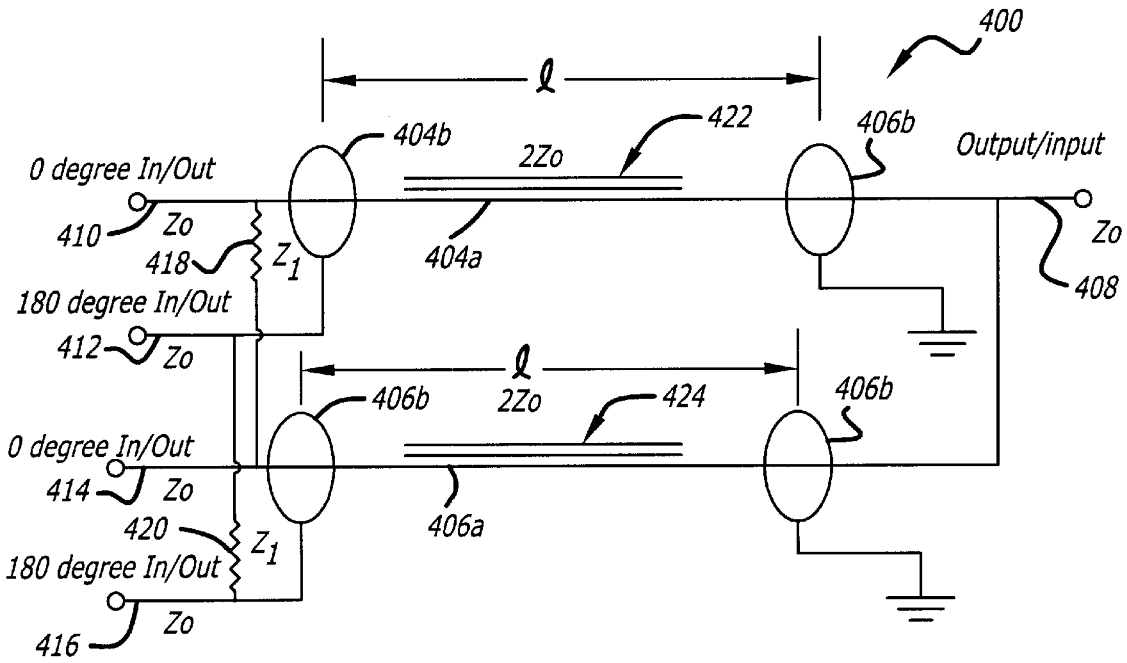
FIG. 4 illustrates a schematic diagram of still another exemplary four-way power combiner/splitter in accordance with the invention.

FIG. 4 illustrates a schematic diagram of still another exemplary four-way power combiner/splitter 400 in accordance with the invention. The four-way power combiner/splitter 400 is a combination of combiner/splitter 200 and 300, and the reference numbers for designating the same elements are same but with the most significant digit being a "4" instead of a "2" or "3". Specifically, the four-way power combiner/splitter 400 includes the impedance elements 418 and 420 to improve the balance of the currents through the transmission lines 404 and 406 to account for imperfections in the four-way power combiner/splitter 400. In addition, the four-way power combiner/splitter 400 includes ferrites 422 and 424 to increase the effective electrical lengths of the transmission lines 404 and 406, respectivelyl.

Figure 5:
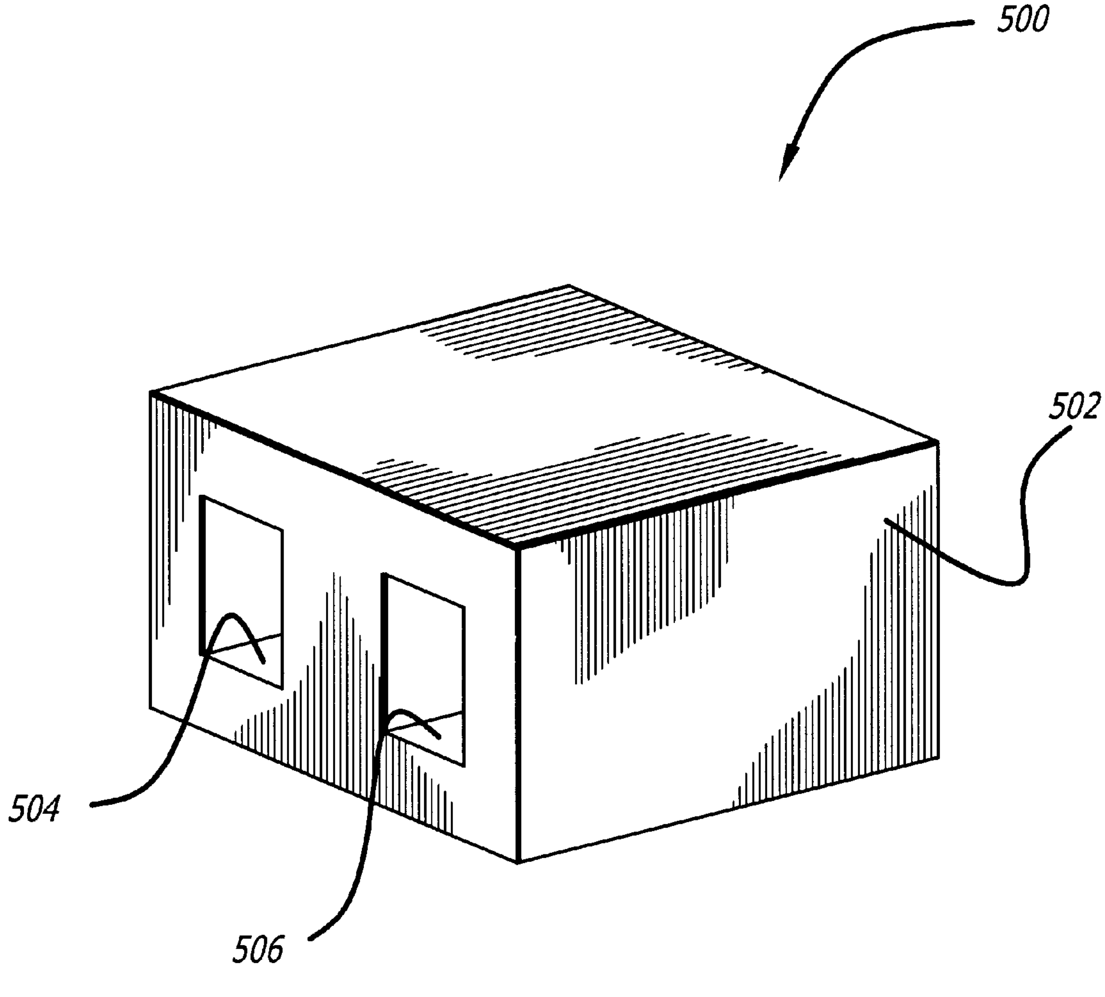
FIG. 5 illustrates a perspective view of an exemplary ferrite with two sections that can be used in connection with the four-way power combiner/splitters of FIGS. 4 and 5.

FIG. 5 illustrates a perspective view of an exemplary ferrite 500 with two sections that can be used in connection with the four-way power combiner/splitters of FIGS. 4 and 5. The ferrite 500 comprises a housing 502 made of ferrite material. The housing 502 includes two through-channels 504 and 506 for respectively receiving therein the transmission lines 304 and 306 of four-way power combiner/splitter 300 or transmission lines 404 and 406 of four-way power combiner/splitter 400. Although the ferrite 500 accommodates both transmission lines of the four-way combiner/splitters 300 and 400, it shall be understood that separate ferrites can be used to accommodate the transmission lines individually.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

What is claimed is:

1. A four-way power combiner/splitter, comprising:

a first transmission line including a first non-grounding conductor and a first grounding conductor, wherein said first grounding conductor is grounded at a first end of said first transmission line;

a second transmission line including a second non-grounding conductor and a second grounding conductor, wherein said second grounding conductor is grounded at a first end of said second transmission line, and further wherein said first and second non-grounding conductors are electrically coupled together at respective first ends of said first and second transmission lines, wherein said first and second transmission lines have substantially the same electrical lengths extending from respective first ends to respective second ends, and wherein said lengths of said first and second transmission lines extending from respective first ends to respective second ends are each less than a quarter wavelength at an operating frequency;

an output/input port electrically coupled to said first and second non-grounding conductor at respective first ends of said first and second transmission lines;

a first input/output port electrically coupled to said first non-grounding conductor at a second end of said first transmission line;

a second input/output port electrically coupled to said first grounding conductor at said second end of said first transmission line;

a third input/output port electrically coupled to said second non-grounding conductor at a second end of said second transmission line; and a fourth input/output port electrically coupled to said second grounding conductor at a second end of said second transmission line.

2. A four-way power combiner/splitter, comprising:

a first transmission line including a first non-grounding conductor and a first grounding conductor, wherein said first grounding conductor is grounded at a first end of said first transmission line;

a second transmission line including a second non-grounding conductor and a second grounding conductor, wherein said second grounding conductor is grounded at a first end of said second transmission line, and further wherein said first and second non-grounding conductors are electrically coupled together at respective first ends of said first and second transmission lines, an output/input port electrically coupled to said first and second non-grounding conductor at respective first ends of said first and second transmission lines;

a first input/output port electrically coupled to said first non-grounding conductor at a second end of said first transmission line;

a second input/output port electrically coupled to said first grounding conductor at said second end of said first transmission line;

a third input/output port electrically coupled to said second non-grounding conductor at a second end of said second transmission line;

a fourth input/output port electrically coupled to said second grounding conductor at a second end of said second transmission line; and a ferrite having two separate channels for receiving therein said first and second transmission lines respectively, wherein said ferrite is capable of increasing electrical lengths of said first and second transmission lines.

3. A four-way power combiner, comprising:

a first transmission line including a first non-grounding conductor and a first grounding conductor, wherein said first grounding conductor is grounded at a first end of said first transmission line;

a second transmission line including a second non-grounding conductor and a second grounding conductor, wherein said second grounding conductor is grounded at a first end of said second transmission line, and further wherein said first and second non-grounding conductors are electrically coupled together at respective first ends of said first and second transmission lines, wherein said first and second transmission lines have substantially the same electrical lengths extending from respective first ends to respective second ends, and wherein said lengths of said first and second transmission lines extending from respective first ends to respective second ends are each less than a quarter wavelength at an operating frequency;

an output port electrically coupled to said first and second non-grounding conductor at respective first ends of said first and second transmission lines;

a first input port electrically coupled to said first non-grounding conductor at a second end of said first transmission line;

a second input port electrically coupled to said first grounding conductor at said second end of said first transmission line;

a third input port electrically coupled to said second non-grounding conductor at a second end of said second transmission line; and a fourth input port electrically coupled to said second grounding conductor at a second end of said second transmission line.

4. A four-way power combiner, comprising:

a first transmission line including a first non-grounding conductor and a first grounding conductor, wherein said first grounding conductor is grounded at a first end of said first transmission line;

a second transmission line including a second non-grounding conductor and a second grounding conductor, wherein said second grounding conductor is grounded at a first end of said second transmission line, and further wherein said first and second non-grounding conductors are electrically coupled together at respective first ends of said first and second transmission lines;

an output port electrically coupled to said first and second non-grounding conductor at respective first ends of said first and second transmission lines;

a first input port electrically coupled to said first non-grounding conductor at a second end of said first transmission line;

a second input port electrically coupled to said first grounding conductor at said second end of said first transmission line;

a third input port electrically coupled to said second non-grounding conductor at a second end of said second transmission line;

a fourth input port electrically coupled to said second grounding conductor at a second end of said second transmission line; and a ferrite having two separate channels for receiving therein said first and second transmission lines respectively, wherein said ferrite is capable of increasing electrical lengths of said first and second transmission lines.

5. A four-way power splitter, comprising:

a first transmission line including a first non-grounding conductor and a first grounding conductor, wherein said first grounding conductor is grounded at a first end of said first transmission line;

a second transmission line including a second non-grounding conductor and a second grounding conductor, wherein said second grounding conductor is grounded at a first end of said second transmission line, and further wherein said first and second non-grounding conductors are electrically coupled together at respective first ends of said first and second transmission lines, wherein said first and second transmission lines have substantially the same electrical lengths extending from respective first ends to respective second ends, and wherein said lengths of said first and second transmission lines extending from respective first ends to respective second ends are each less than a quarter wavelength at an operating frequency;

an input port electrically coupled to said first and second non-grounding conductor at respective first ends of said first and second transmission lines;

a first output port electrically coupled to said first non-grounding conductor at a second end of said first transmission line;

a second output port electrically coupled to said first grounding conductor at said second end of said first transmission line;

a third output port electrically coupled to said second non-grounding conductor at a second end of said second transmission line; and a fourth output port electrically coupled to said second grounding conductor at a second end of said second transmission line.

6. A four-way power splitter, comprising:

a first transmission line including a first non-grounding conductor and a first grounding conductor, wherein said first grounding conductor is grounded at a first end of said first transmission line;

a second transmission line including a second non-grounding conductor and a second grounding conductor, wherein said second grounding conductor is grounded at a first end of said second transmission line, and further wherein said first and second non-grounding conductors are electrically coupled together at respective first ends of said first and second transmission lines;

an input port electrically coupled to said first and second non-grounding conductor at respective first ends of said first and second transmission lines;

a first output port electrically coupled to said first non-grounding conductor at a second end of said first transmission line;

a second output port electrically coupled to said first grounding conductor at said second end of said first transmission line;

a third output port electrically coupled to said second non-grounding conductor at a second end of said second transmission line;

a fourth output port electrically coupled to said second grounding conductor at a second end of said second transmission line; and a ferrite having two separate channels for receiving therein said first and second transmission lines respectively, wherein said ferrite is capable of increasing electrical lengths of said first and second transmission lines.

* * * * *